US 7,123,082 B2

(12) United States Patent
Kurose et al.

(10) Patent No.: US 7,123,082 B2
(45) Date of Patent: *Oct. 17, 2006

(54) VARIABLE TIME CONSTANT CIRCUIT AND FILTER CIRCUIT USING THE SAME

(75) Inventors: Daisuke Kurose, Yokohama (JP); Tetsuro Itakura, Tokyo (JP); Rui Ito, Chigasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/258,934

(22) Filed: Oct. 27, 2005

(65) Prior Publication Data

US 2006/0033560 A1   Feb. 16, 2006

Related U.S. Application Data

(62) Division of application No. 10/743,949, filed on Dec. 24, 2003, now Pat. No. 6,977,541.

(30) Foreign Application Priority Data

Dec. 27, 2002   (JP)   ............................. 2002-382381
Oct. 31, 2003   (JP)   ............................. 2003-372442

(51) Int. Cl.
   *H04B 1/10*   (2006.01)
(52) U.S. Cl. ...................... 327/552; 327/553; 327/558; 330/303
(58) Field of Classification Search ..................... None
   See application file for complete search history.

(56) References Cited

U.S. PATENT DOCUMENTS

| 4,114,117 | A | 9/1978 | Ford |
| 4,509,019 | A | 4/1985 | Banu et al. |
| 4,710,726 | A | 12/1987 | Czamul |
| 4,780,690 | A | 10/1988 | Voorman |
| 4,851,719 | A | 7/1989 | Hitomi |
| 5,880,634 | A | 3/1999 | Babanezhad |
| 5,990,737 | A | 11/1999 | Czamul et al. |
| 6,650,177 | B1 | 11/2003 | Tan |
| 6,781,464 | B1 | 8/2004 | Ueno et al. |
| 6,977,541 | B1 * | 12/2005 | Kurose et al. .............. 327/552 |

FOREIGN PATENT DOCUMENTS

JP   3335872   8/2002

OTHER PUBLICATIONS

Notification of the First Office Action issued by the Chinese Patent Office, dated March 31, 2006, in Chinese Application No. 2003101244467 and English translation of Notification.

* cited by examiner

*Primary Examiner*—Timothy P. Callahan
*Assistant Examiner*—An T. Luu
(74) *Attorney, Agent, or Firm*—Finnegan, Henderson, Farabow, Garrett & Dunner, L.L.P.

(57) ABSTRACT

A variable time constant circuit includes an inverting amplifier which has an amplifier input terminal and an amplifier output terminal connected to a signal output terminal and inverts a signal inputted to the amplifier input terminal, a first and a second resistor which are connected in series between the signal input terminal and the amplifier input terminal, a capacitor connected between the amplifier input terminal and the amplifier output terminal, a field effect transistor including a gate terminal connected to a junction point of the first and second resistors, a source terminal kept at a constant potential, and a drain terminal connected to the amplifier input terminal, the transistor flowing a current through the drain terminal according to a voltage between the gate terminal and the source terminal, and a control circuit which controls a voltage-current conversion ratio of the transistor according to a time constant control signal.

7 Claims, 4 Drawing Sheets

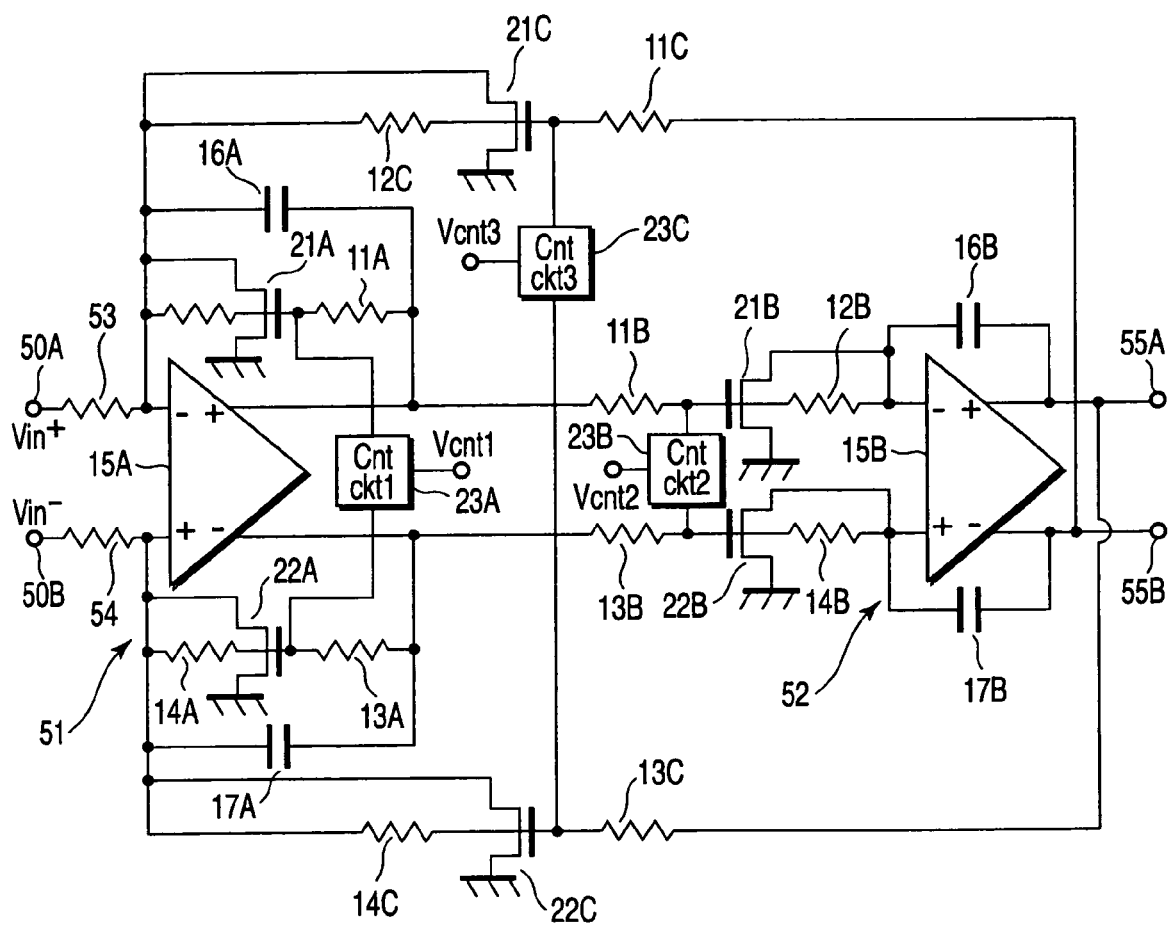
F I G. 9

VARIABLE TIME CONSTANT CIRCUIT AND FILTER CIRCUIT USING THE SAME

CROSS-REFERENCE TO RELATED APPLICATIONS

This is a division of application Ser. No. 10/743,949, filed Dec. 24, 2003, now U.S. Pat. No. 6,977,541, which is incorporated herein by reference.

This application is based upon and claims the benefit of priority from the prior Japanese Patent Applications No. 2002-382381, filed Dec. 27, 2002; and No. 2003-372442, filed Oct. 31, 2003, the entire contents of both of which are incorporated herein by reference.

BACKGROUND OF THE INVENTION

1. Field of the Invention

This invention relates to a variable time constant circuit, such as a variable time constant integrator or a variable cut-off frequency filter, and more particularly to a variable time constant circuit using a field effect transistor and a filter circuit using the variable time constant circuit.

2. Description of the Related Art

To make a transfer characteristic of an active filter, such as a cut-off frequency, variable, the time constant of a time constant circuit included in the active filter has to be changed. One known method for achieving this is to use the drain-source resistance (on resistance) of a field effect transistor in the triode region as a variable resistor for a variable time constant circuit to control the gate voltage of the transistor, thereby changing the time constant. For example, U.S. Pat. No. 4,710,726 has disclosed a variable resistor circuit network that cancels odd-degree distortions by using a plurality of FETs (field effect transistors) differing in gate voltage.

In a circuit using the on resistance of such an FET as a variable resistor, the drain-source of the FET is connected in series with a signal source. Thus, when the power supply voltage gets lower, the gate-source voltage of the FET cannot be made sufficiently high, with the result that the FET turns off. As described above, in the conventional variable time constant circuit, there is a possibility that the FET used as a variable resistor will not turn on at a low power supply voltage and therefore will not function as an integrator or a filter.

It is, accordingly, an object of the present invention to provide a variable time constant circuit capable of operating positively even at a low power supply voltage and a filter circuit using the viable time constant circuit.

BRIEF SUMMARY OF THE INVENTION

According to a first aspect of the present invention, there is provided the variable time constant circuit using a time constant control signal, comprising: a signal input terminal; an inverting amplifier which has an amplifier input terminal and an amplifier output terminal and inverts a signal inputted to the amplifier input terminal; a signal output terminal connected to the amplifier output terminal; a first resistor and a second resistor which are connected in series between the signal input terminal and the amplifier input terminal; a capacitor connected between the amplifier input terminal and the amplifier output terminal; a field effect transistor including a gate terminal connected to a junction point of the first and second resistors, a source terminal kept at a constant potential, and a drain terminal connected to the amplifier input terminal, the field effect transistor flowing a current corresponding to a voltage-current conversion ratio through the drain terminal according to a voltage between the gate terminal and the source terminal; and a control circuit which controls the voltage-current conversion ratio of the transistor according to the time constant control signal.

According to a second aspect of the present invention, there is provided a variable time constant circuit using a time constant control signal, comprising: a first signal input terminal and a second signal input terminal; an inverting amplifier including a positive input terminal, a negative input terminal, a negative output terminal, and a positive output terminal; a first signal output terminal and a second signal output terminal which are connected to the negative output terminal and positive output terminal, respectively; a first resistor and a second resistor which are connected in series between the first signal input terminal and the positive input terminal; a third resistor and a fourth resistor which are connected in series between the second signal input terminal and the negative input terminal; a first capacitor connected between the positive input terminal and the negative output terminal; a second capacitor connected between the negative input terminal and the positive output terminal; a first field effect transistor including a first gate terminal connected to a first junction point of the first resistor and the second resistor, a first source terminal kept at a constant potential, and a first drain terminal connected to one of the positive input terminal and negative input terminal, the first field effect transistor flowing a current corresponding to a first voltage-current conversion ratio through the first drain terminal according to the voltage between the first gate terminal and the first source terminal; a second field effect transistor including a second gate terminal connected to a second junction point of the third and the fourth resistor, a second source terminal kept at a constant potential, and a second drain terminal connected to the other of the positive input terminal and negative input terminal, the second field effect transistor flowing a current corresponding to a second voltage-current conversion ratio through the second drain terminal according to a voltage between the second gate terminal and the second source terminal; and a control circuit which controls the first voltage-current conversion ratio of the first field effect transistor and the second voltage-current conversion ratio of the second field effect transistor according to the time constant control signal.

BRIEF DESCRIPTION OF THE SEVERAL VIEWS OF THE DRAWING

FIG. 9 is a circuit diagram of a filter circuit according to a fourth embodiment of the present invention.

DETAILED DESCRIPTION OF THE INVENTION (First Embodiment)

Figure 1:
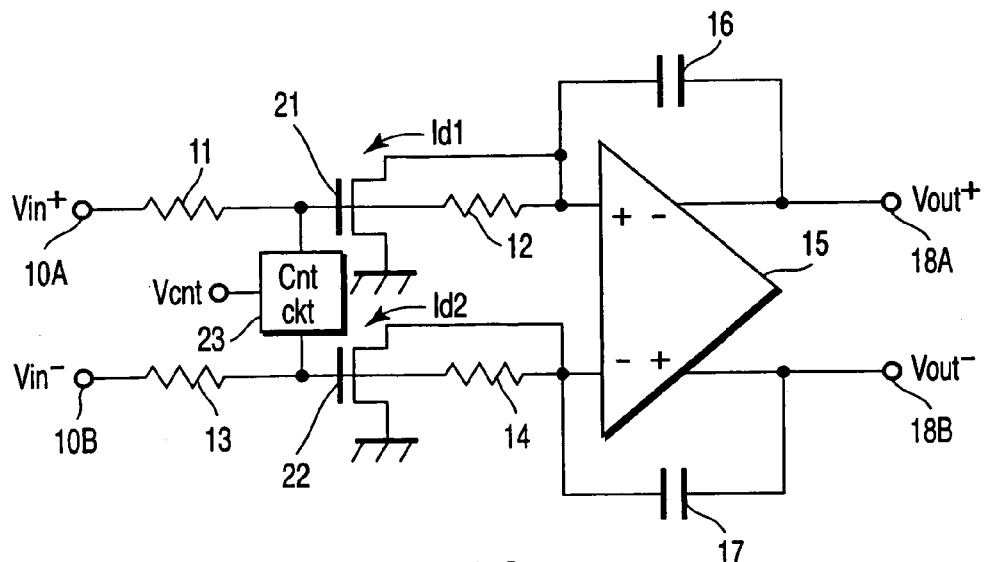
FIG. 1 is a circuit diagram of a variable time constant circuit according to a first embodiment of the present invention.

In FIG. 1, a variable time constant circuit according to a first embodiment of the present invention functions as an integrator whose integral time constant is variable or a linear filter circuit whose cut-off frequency is variable. Hereinafter, explanation will be given, taking a differential variable time constant circuit as an example.

In FIG. 1, a positive input signal Vin+ and a negative input signal Vin− which form a differential input signal are inputted to a first signal input terminal 10A (positive signal input terminal) and a second signal input terminal 10B (negative signal input terminal), respectively. The signal input terminal 10A is connected to one end of a resistor 11. The signal input terminal 10B is connected to one end of a resistor 13. The other end of the resistor 11 is connected to one end of a resistor 12. The other end of the resistor 13 is connected to one end of a resistor 14. The other ends of the resistors 12 and 14 are connected to a positive input terminal (also referred to as noninverting input terminal) and a negative input terminal (also referred to as inverting input terminal) of a differential-input/differential-output inverting amplifier 15, respectively. Specifically, the resistors 11 and 12 are connected in series between the signal input terminal 10A and the positive input terminal of the inverting amplifier 15. The resistors 13 and 14 are connected in series between the signal input terminal 10B and the negative input terminal of the inverting amplifier 15.

An integral capacitor 16 is connected between the positive input terminal and negative output terminal (also referred to as the inverted output terminal) of the inverting amplifier 15. An integral capacitor 17 is connected between the negative input terminal and positive output terminal (also referred to as the noninverted output terminal) of the inverting amplifier 15. The negative output terminal and positive output terminal of the inverting amplifier 15 are connected to signal output terminals 18A and 18B, respectively. The signal output terminals 18A and 18B output a positive output signal Vout+ and a negative output signal Vout− respectively, which are differential output signals obtained by integrating or filtering the differential input signals Vin+ and Vin−.

The gate terminals of FETs 21 and 22 are connected to a junction point of the resistors 11 and 12 and a junction point of the resistors 13 and 14, respectively. The drain terminal of the FET 21 is connected to the positive input terminal of the inverting amplifier 15. The drain terminal of the FET 22 is connected to the negative input terminal of the inverting amplifier 15. The source terminals of the FETs 21 and 22 are connected to a constant potential point, such as the ground in this embodiment.

A first and a second control output terminal of a control circuit 23 are connected to the junction point of the resistors 11 and 12 and the junction point of the resistors 13 and 14, or the gate terminals of the FETs 21 and 22, respectively. According to a control signal Vcnt supplied to a control input terminal from outside the variable time constant circuit, the control circuit 23 controls the gate bias voltages of the FETs 21 and 22, thereby controlling the voltage-current conversion ratio gm of each of the FETs 21 and 22. In the first embodiment, because the control signal Vcnt is a voltage signal, it is hereinafter called a control voltage.

It is desirable that the inverting amplifier 15 should have a circuit configuration that causes an in-phase voltage to be externally applied so as to prevent the differential signal voltage applied between the gates of the FETs 21 and 22 from varying due to a change in the control signal Vcnt. Of course, an inverting amplifier with another configuration may be used.

In the variable time constant circuit of the first embodiment, the control circuit 23 changes the gate bias voltages of the FETs 21 and 22 according to the control voltage Vcnt, thereby changing the current flowing from the capacitors 16 and 17 into the drains of the FETs 21 and 22. This changes the resistance that, together with the capacitances of the capacitors 16 and 17, determines the time constant, thereby realizing the variation of the time constant. A variation in the time constant causes the integral time constant to change when the variation time constant circuit is an integrator or the cut-off frequency to change when the variation time constant circuit is a filter.

Next, the operation of the variable time constant circuit of the first embodiment will be explained in detail. The time constant of the variable time constant circuit is determined by the product of the resistance (assumed to be R) between the signal input terminals 10A and 10B and the positive input terminal and negative input terminal of the inverting amplifier 15 and the capacitance (assumed to be C) of the capacitors 16 and 17. In the first embodiment, the control circuit 23 controls the operating the junction point of the resistors 11 and 12 and the junction point of the resistors 13 and 14, that is, the gate bias voltages of the FTTs 21 and 22 according to the control voltage Vcnt, thereby changing the resistance R.

The control circuit 23 including a voltage follower as explained later, supplies the same voltage as the supplied control voltage Vcnt to the gate terminals of the FETs 21 and 22. As a result, since the gm of each of the FETs 21 and 22 changes according to the control voltage Vcnt, the current flowing in each of the capacitors 16 and 17 changes, with the result that the resistance of each of the resistors 12 and 14 apparently changes.

For example, since the gm of each of the FETs 21 and 22 increases as the control voltage Vcnt gets higher, and therefore the current flowing in each of the capacitors 16 and 17 decreases, the resistance of each of the resistors 12 and 14 becomes apparently larger. As a result, the time constant of the circuit changes. The drain currents Id1 and Id2 flowing into the FETs 21 and 22 respectively are expressed as:

$$I_{d1} = k'(V_{GS1} - V_{th})^2 = k'(v_1 - V_{CNT} - V_{th})^2$$

$$I_{d2} = k'(V_{GS2} - V_{th})^2 = k'(v_2 - V_{CNT} - V_{th})^2 \quad (1)$$

where k' is the transfer conductance parameter, $V_{GS1}$ and $V_{GS2}$ are the gate-source voltages of the FETs 21 and 22, respectively, Vth is the threshold voltage, and v1 and v2 are variations in the differential input signals Vin+ and Vin− at the gate terminals of the FETs 21 and 22, respectively. The gate-source voltages $V_{GS1}$ and $V_{GS2}$ of the FETs 21 and 22 vary with amplitudes of v1 and v2, centering on the control voltage Vcnt. Since the variable time constant circuit of the first embodiment is of the differential type, the gm of each of the FETs 21 and 22 in a differential operation is expressed from v2=−v1 as:

$$gm = 4k'(V_{CNT} - V_{th}) \quad (2)$$

As seen from equation (2), the gm changes according to the control voltage Vcnt. As described above, with the first embodiment, it is possible to realize a variable time constant circuit whose time constant is changed by changing the gm of each of the FETs 21 and 22 according to the control voltage Vcnt.

In the circuit disclosed in U.S. Pat. No. 4,710,726, the on resistor of the FET is used as a variable resistor and the drain-source of the FET is connected in series with the signal source. Consequently, when the power supply voltage is low, the FET cannot be turned on and therefore the positive operation is not assured. In the first embodiment, however, the gate terminals of the FETs 21 and 22 are connected to the signal input terminals 10A and 10B via the resistors 11 and 13, respectively, with their source terminals connected to a constant potential point (for example, the ground). Accordingly, even when the power supply is low, the FETs 21 and 22 are turned on, enabling the variable time constant circuit to operate positively.

While in the first embodiment, a differential variable time constant circuit has been explained, the present invention may be applied to a single-phase variable time constant circuit. A single-phase variable time constant circuit can be realized by using the upper half or lower half of the configuration of FIG. 1. For example, a variable time constant circuit with the upper half of the configuration of FIG. 1 including only the signal input terminal 10A, resistors 11 and 12, inverting amplifier 15, capacitor 16, signal output terminal 18A, FET 21., and control circuit 23. In that case, the inverting amplifier 15 has an ordinary one-input/one-output configuration. In the control circuit 23, the terminal not connected to the junction point of the resistors 11 and 12 is connected to a constant potential point, for example, the ground.

(Second Embodiment)

Figure 2:
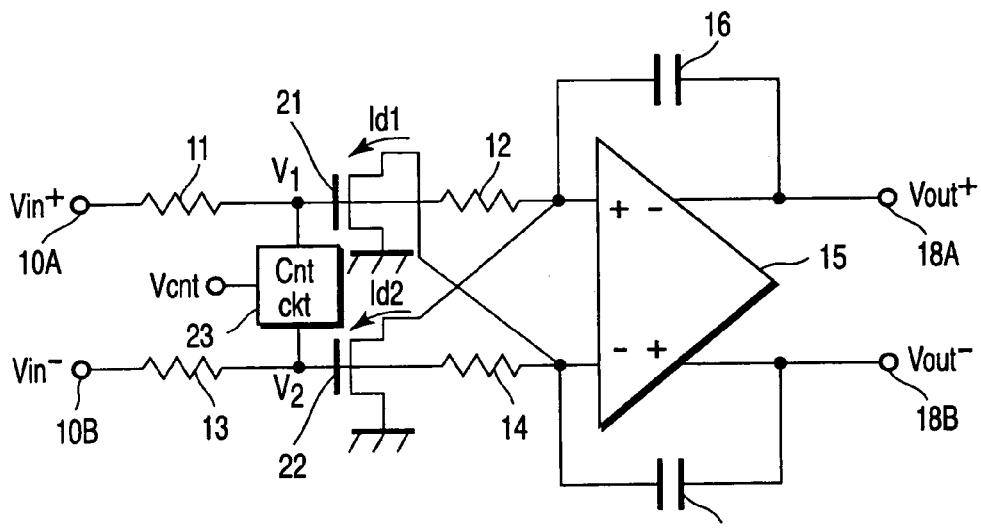
FIG. 2 is a circuit diagram of a variable time constant circuit according to a second embodiment of the present invention.

As shown in FIG. 2, a variable time constant circuit according to a second embodiment of the present invention differs from the variable time constant circuit of the first embodiment in FIG. 1 in that the connections of the drain terminals of the FETs 21 and 22 are crossed. Specifically, the drain terminal of the FET 21 is connected to the negative input terminal of the inverting amplifier 15 and the drain terminal of the FET 22 is connected to the positive input terminal of the inverting amplifier 15.

In the second embodiment, as the voltages of the differential input signals Vin+ and Vin− and the control voltage Vcnt increase, the current flowing in each of the capacitors 16 and 17 increases differently from the first embodiment. As a result, the resistance R between the signal input terminals 10A and 10B and the positive input terminal and negative input terminal of the inverting amplifier 15 decreases. Thus, the time constant of the circuit can be varied by changing the gm of each of the FETs 21 and 22 according to the control voltage Vcnt.

(About the Control Circuit 23)

Next, the control circuit 23 will be explained concretely. The control circuit of FIG. 3 including of a first differential input terminal pair of a first positive input terminal and a first negative input terminal, a second differential input terminal pair of a second positive input terminal and a second negative input terminal, and a differential amplifier 30 having a first and a second positive output terminal.

The first and second positive input terminals connected equally to a control input terminal 31 to which the control voltage Vcnt signal is inputted. The first positive output terminal is connected not only to the first negative input terminal but also to the junction point of the resistors 11 and 12 and the gate terminal of the FET 21 in FIG. 1 via a first control output terminal 32. The second positive output terminal is connected not only to the second negative input terminal but also to the junction point of the resistors 13 and 14 and the gate terminal of the FET 22 in FIG. 1 via a second control output terminal 33.

Figure 3:
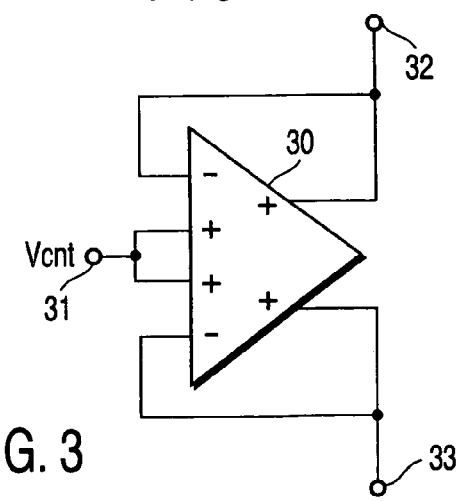
FIG. 3 is a block diagram schematically showing the configuration of the control circuit shown in each of FIGS. 1 and 2.

The control circuit of FIG. 3 has a voltage follower configuration in which the control voltage Vcnt is outputted to the two positive output terminals of the amplifier 30 in an in-phase situation. Since the output impedance is low, if the gain of the amplifier 30 is sufficiently high, the control output terminals 32 and 33 are in the open state when viewed from the outside world. In a differential situation, the control voltage Vcnt is applied directly between the gate terminals of the FETs 21 and 22.

Figure 4:
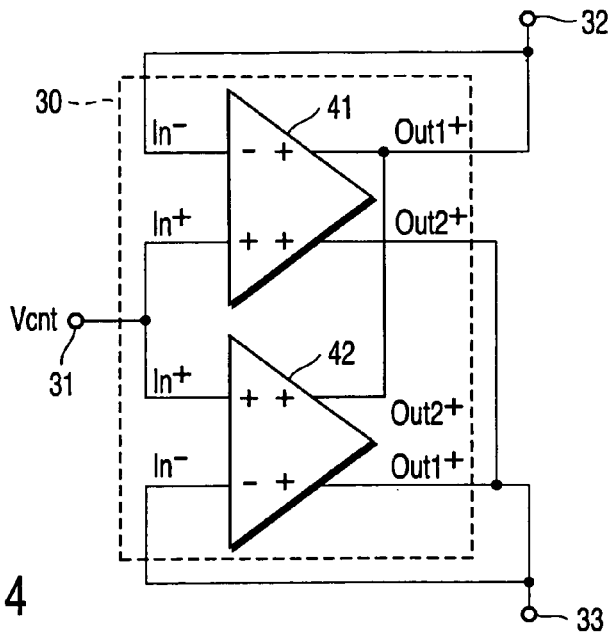
FIG. 4 is a detailed block diagram of the control circuit of FIG. 3.

In the circuit of FIG. 4 showing the differential amplifier 30 of FIG. 3 in more detail, two differential amplifiers 41 and 42 each having a differential input terminal pair and a positive output terminal pair have their positive output terminal pairs connected to each other. Specifically, the differential amplifier 30 of FIG. 4 including a first differential amplifier 41 having a first positive input terminal, a first negative input terminal, and a first and a second positive output terminals and a second differential amplifier 42 having a second positive input terminal, a second negative input terminal, and a third and a fourth positive output terminals.

The first and second positive input terminals are connected equally to the control input terminal 31. The first and third positive output terminals are connected not only to the first negative input terminal but also to the junction point of the resistors 11 and 12 of FIG. 1 via the first control output terminal 32. The second and fourth positive output terminals are connected not only to the second negative input terminal but also to the junction point of the resistors 13 and 14 of FIG. 1 via the second control output terminal 33.

Figure 5:
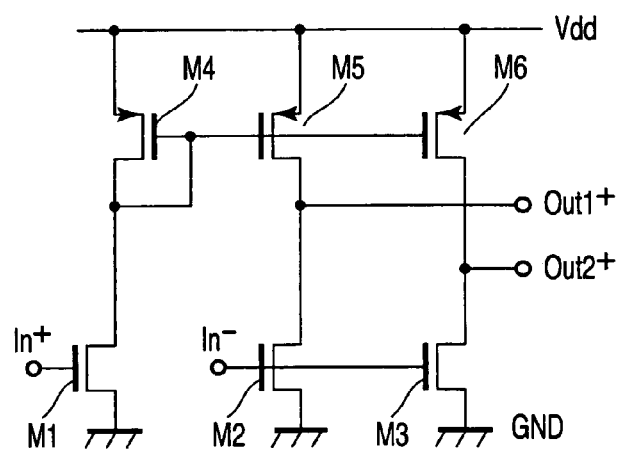
FIG. 5 shows a concrete example of a differential amplifier included in the control circuit of FIG. 4.

FIG. 5 shows a concrete circuit of each of the two differential amplifiers 41 and 42 shown in FIG. 4. The circuit of FIG. 5 has a configuration that has a common-source transistor folded at a current source. Specifically, transistors M1, M2, and M3 are common-source transistors. The gate terminal of the transistor M1 corresponds to the positive input terminal In+. The gate terminals of the transistors M2 and M3 are connected to each other and correspond to the negative input terminal In−. Transistors M4, M5, and M6 constitute a current-mirror circuit.

The drain terminal of transistor M1 is connected to the junction point of the gate terminal and drain terminal of transistor M4, the current input terminal of the current-mirror circuit. The drain terminals of the transistors M2 and M3 are connected to the drain terminal of the transistor M5 and the drain terminal of the transistor M6, the two current output terminals of the current mirror circuit. The drain terminals of the transistors M2 and M3 correspond to the positive output terminals Out+1 and Out+2, respectively.

Figure 6:
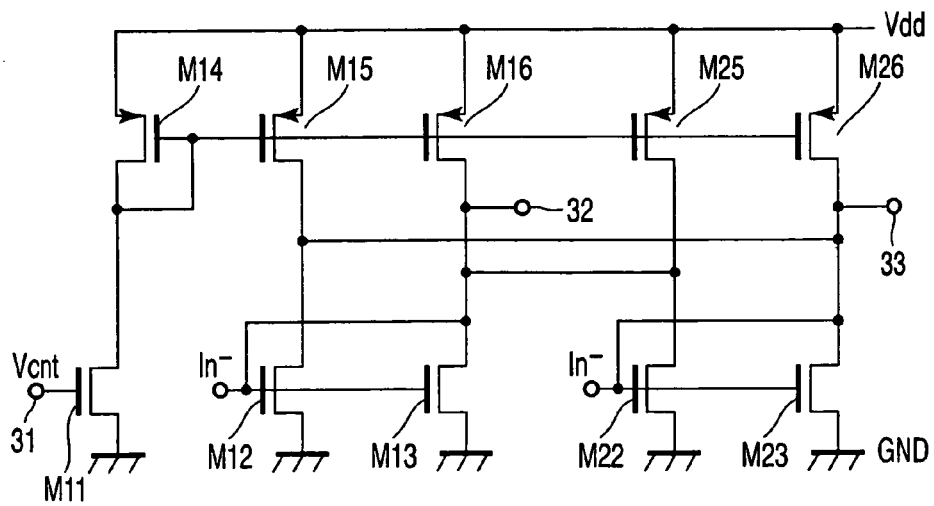
FIG. 6 is a concrete circuit diagram of the control circuit of FIG. 4 realized by using the differential amplifier of FIG. 5.

FIG. 6 shows a circuit that realizes the control circuit 30 of FIG. 4 by using the differential amplifier of FIG. 5. In the control circuit 30 of FIG. 4, since the positive input terminals of the two differential amplifiers 41 and 42 are connected equally to the control input terminal 31, the circuit on the positive input side can be shared to simplify the circuit configuration as shown in FIG. 6. In FIG. 6, a transistor M11 corresponds to the transistor M1 of FIG. 5 and a transistor M14 corresponds to the transistor M4 of FIG. 5. Since the common positive input terminal of the differential amplifiers 41 and 42 of FIG. 4 is connected to the control input terminal 31, the transistors M11 and M14 are shared by the two differential amplifiers 41 and 42.

In FIG. 6, transistors M12 and M22 correspond to the transistor M2 of FIG. 5. Transistors M13 and M23 correspond to the transistor M3 of FIG. 5. Transistors M15 and M25 correspond to the transistor M5 of FIG. 5. Transistors M16 and M26 correspond to the transistor M6 of FIG. 5. The transistors M12, M13, M15, and M16 and the transistors M22, M23, M25, and M26 are provided separately for the two differential amplifiers 41 and 42.

(Third Embodiment)

Figure 7:
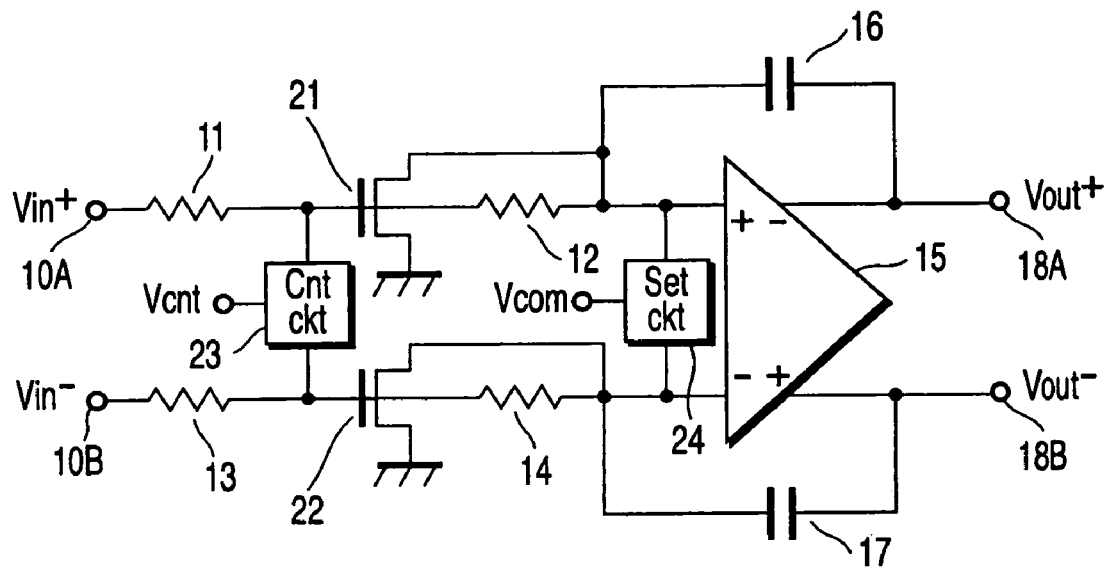
FIG. 7 is a circuit diagram of a variable time constant circuit according to a third embodiment of the present invention.
Figure 8:
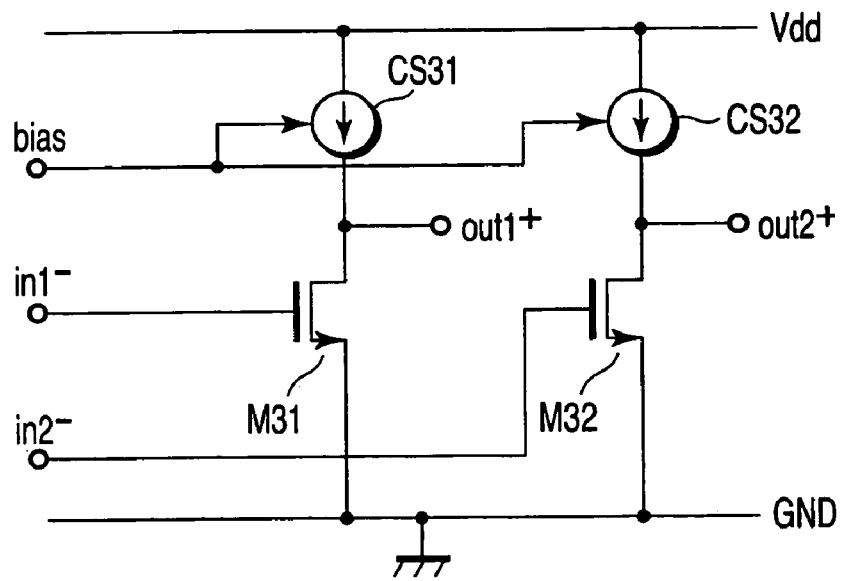
FIG. 8 is a circuit diagram showing a concrete example of the inverting amplifier of FIG. 7.

As shown in FIG. 7, a variable time constant circuit according to a third embodiment of the present invention is such that an operating point setting circuit 24 is added to the variable time constant circuit of FIG. 1. According to an operating point setting signal Vcom supplied from outside the variable time constant circuit, the operating point setting circuit 24 sets an operating point for each of the positive input terminal and negative input terminal of the inverting amplifier 15. When the variable time constant circuit is operated from a low voltage power supply, to secure a sufficient signal amplitude, it is desirable that, for example, a common-source amplifier as shown in FIG. 8 should be used as the inverting amplifier 15. The operating point setting circuit 24 is particularly useful when the inverting amplifier 15 is realized by a common-source-amplifier.

In FIG. 8, the gate terminal of the MOS transistor M31 is connected to the positive input terminal in+ and the gate terminal of the MOS transistor M32 is connected to the negative input terminal in−. The source terminals of the transistors M31 and M32 are connected to the ground GND. The drain terminal of the transistor M31 is connected to one end of a current source CS31, a load. The drain terminal of the transistor M32 is connected to one end of a current source CS32, a load. The other ends of the current sources CS31 and CS32 are connected to a power supply Vdd. The drain terminal of the transistor M31 is connected to a negative output terminal out−. The drain terminal of the transistor M32 is connected to a positive output terminal out+.

To cause the common-source transistors M31 and M32 to operate stably in the saturated region, when the operating point of each of the input terminals in+ and in− varies, the current in each of the current sources CS31 and CS32, or the bias current in each of the transistors M31 and M32, has to be changed according to the variation. The bias currents in the transistors M31 and M32 are determined by the bias voltage bias applied to the gate terminals of the transistors M31 and M32. Specifically, when the operating point of each of the input terminals in+ and in− goes up, this increases the bias current, resulting in an increase in the power consumption. Conversely, when the operating point of each of the input terminals in+ and in− goes down, the bias current decreases. When the bias current decreases, the voltage-current conversion ratio (gm) also decreases, with the result that the frequency band becomes narrower. To solve the problem of variations in the operating point, the operating point setting circuit 24 is connected to the input terminals in+ and in− in the third embodiment.

The operating point setting circuit 24 sets the operating point of each of the input terminals in+ and in− of FIG. 8 to a specific value according to an operating point setting signal Vcom. The operating point setting circuit 24 is configured as shown in, for example, FIGS. 3 and 4 as is the control circuit 23. In that case, the operating point setting signal Vcom is inputted to the control input terminal 31 of FIG. 3 or 4. The control output terminals 32 or 33 in FIG. 3 or 4 are connected to the input terminals in+, in− of FIG. 8. A similar operating point setting circuit may be added to the variable time constant circuit of the second embodiment shown in FIG. 2.

(Fourth Embodiment)

FIG. 9 shows an embodiment of the present invention in which the variable time constant circuit explained in the first embodiment is applied to a quadratic biquad filter. In the filter circuit, two variable time constant circuits 51 and 52 are connected in cascade. A positive input signal Vin+ and a negative input signal Vin− which form a differential input signal are inputted to a first signal input terminal 50A and a second signal input terminal 50B respectively. Differential input signals inputted to signal input terminals 50A and 50B pass through the variable time constant circuits 51 and 52 are outputted at signal output terminals 55A and 55B.

The variable time constant circuit 52 at the second stage has resistor 11B, 12B, 13B and 14B and a inverting amplifier 15B and capacitor 16B and 17B and a control circuit 23B as well as variable time constant circuit which showed it in the FIG. 1. In the variable time constant circuit 51 at the first stage, one end of the resistor 53 is connected to a signal input terminal 50A, and one end of the resistor 54 is connected to the signal input terminal 50B. The other end of the resistor 53 is connected to the negative input terminal of the inverting amplifier 15A. The other end of the resistor 54 is connected to the positive input terminal of the inverting amplifier 15A. An integral capacitor 16A is connected between the negative input terminal and the positive output terminal of the inverting amplifier 15A. An integral capacitor 17A is connected between the positive input terminal and the negative output terminal of the inverting amplifier 15A.

A first variable resistance circuit which includes resistors 11A and 12A and FET 21A is connected in parallel to the capacitor 16A. The second variable resistance circuit which includes resistors 13A and 14A and FET 22A is connected in parallel to the capacitor 17A. A gate terminal of FET 21A is connected to the junction point of resistors 11A and 12A. A gate terminal of FET 22A is connected to the junction point of resistors 13A and 14A. Drain terminal of FET 21A is connected to the negative input terminal of the inverting amplifier 15A. Drain terminal of FET 22A is connected to the positive input terminal of the inverting amplifier 15A. The source terminals of the FETs 21A and 22B are connected to a constant potential point, such as the ground. The first control output terminal of a control circuit 23A is connected to a junction point of resistors 11A and 12A, or the gate terminal of FET 21A. The second control output terminal of a control circuit 23A is connected to the resistors 13A and 14A, or the gate terminal of FET 22A. According to a control voltage Vcnt1 supplied to a control input terminal from outside the variable time constant circuit, the control circuit 23A controls the gate bias voltages of the FETs 21A and 22a, thereby controlling the voltage-current conversion ratio gm of each of the FETs 21A and 22A. As a result, the resistance value of the first and second variable resistance circuits changes.

The output of the variable time constant circuit 52 at the second stage is fed back to the variable time constant circuit 51 at the first stage by a third and fourth variable resistance circuits. The third variable resistance circuit includes resistances 11C and 12C and FET 21. The fourth variable resistance circuit includes resistances 13C and 14C and FET 22.

In other words, the gate terminal of FET 21C is connected to the junction point of the resistors 11C and 12C. The gate terminal of FET 22C is connected to the junction point of the resistors 13C and 14C. Drain terminal of FET 21C is connected to the negative input terminal of the inverting amplifier 15A. Drain terminal of FET 22C is connected to the positive input terminal of the inverting amplifier 15A. The source terminals of the FETs 21C and 22C are connected to a constant potential point, such as the ground. The first control output terminal of the control circuit 23C is connected to the junction point of the resistors 11C and 12C, or the gate terminal of FET21C. The second control output terminal of the control circuit 23C is connected to the junction point of the resistors 13C and 14C, or the gate terminal of FET 22C. A control circuit 23C controls voltage-current conversion ratio gm of FET 21C and 22C by controlling the gate bias voltage of FET 21C and 22C in accordance with the control voltage Vcnt3. As a result, the resistance value of the third and fourth variable resistance circuits changes.

In a high-order filter circuit, such as the quadratic biquad filter, the cut-off frequency can be changed by changing the time constants of the variable time constant circuits 51 and 52 and feedback resistance of according to the control voltages Vcnt1, Vcnt2 and Vcont3 applied to the control circuits 23A, 23B and 23C. A similar filter circuit can be realized by using the variable time constant circuit explained in the second embodiment. While in the fourth embodiment, a biquad filter has been used, the variable time constant circuits explained above may be applied to other various types of active filters.

Additional advantages and modifications will readily occur to those skilled in the art. Therefore, the invention in its broader aspects is not limited to the specific details, representative embodiments shown and described herein. Accordingly, various modifications may be made without departing from the spirit or scope of the general inventive concept as defined by the appended claims and their equivalents.

What is claimed is:

1. A filter circuit comprising a plurality of unit filters connected in cascade, each of which includes a variable time constant circuit, the variable time constant circuit using a time constant control signal and comprising:
   a first signal input terminal and a second signal input terminal;
   an inverting amplifier including a positive input terminal, a reverse phase input terminal, a negative output terminal, and a positive output terminal;
   a first signal output terminal and a second signal output terminal which are connected to the negative output terminal and positive output terminal, respectively;
   a first resistor and a second resistor which are connected in series between the first signal input terminal and the positive input terminal;
   a third resistor and a fourth resistor which are connected in series between the second signal input terminal and the negative input terminal;
   a first capacitor connected between the positive input terminal and the negative output terminal;
   a second capacitor connected between the negative input terminal and the positive output terminal;
   a first field effect transistor including a first gate terminal connected to a first junction point of the first resistor and the second resistor, a first source terminal kept at a constant potential, and a first drain terminal connected to one of the positive input terminal and negative input terminal, the first field effect transistor flowing a current corresponding to a first voltage-current conversion ratio through the first drain terminal according to the voltage between the first gate terminal and the first source terminal;
   a second field effect transistor including a second gate terminal connected to a second junction point of the third and the fourth resistor, a second source terminal kept at a constant potential, and a second drain terminal connected to the other of the positive input terminal and negative input terminal, the second field effect transistor flowing a current corresponding to a second voltage-current conversion ratio through the second drain terminal according to a voltage between the second gate terminal and the second source terminal; and
   a control circuit which controls the first voltage-current conversion ratio of the first field effect transistor and the second voltage-current conversion ratio of the second field effect transistor according to the time constant control signal;
   wherein the control circuit controls a first operating point of the first gate terminal and a second operating point of the second gate terminal according to the time constant control signal.

2. The filter circuit according to claim 1, wherein the control circuit includes a differential amplifier including a first differential input terminal pair having a first positive input terminal and a first negative input terminal, a second differential input terminal pair having a second positive input terminal and a second negative input terminal, a first positive output terminal, and a second positive output terminal, and
   the first and second positive input terminals receive the time constant signal, the first positive output terminal is connected not only to the first negative input terminal but also to the first junction point, and the second positive output terminal is connected not only to the second negative input terminal but also to the second junction point.

3. The filter circuit according to claim 1, wherein the control circuit includes a first differential amplifier having a first positive input terminal, a first negative input terminal, a first positive output terminal, and a second positive output terminal, and a second differential amplifier which has a second positive input terminal, a second negative input terminal, a third positive output terminal, and a fourth positive output terminal, and
   the first positive input terminal and the second positive input terminal receive the time constant control signal, the first positive output terminal and third positive output terminal are connected not only to the first negative input terminal but also to the first junction point, and the second positive output terminal and fourth positive output terminal are connected not only to the second negative input terminal but also to the second junction point.

4. The filter circuit according to claim 1, wherein the inverting amplifier includes a common-source amplifier.

5. The filter circuit using an operating point setting signal and according to claim 1, the variable time constant circuit further comprising an operating point setting circuit which sets an operating point of each of the positive input terminal and negative input terminal of the inverting amplifier according to the operating point setting signal.

6. The filter circuit according to claim 5, wherein the operating point setting circuit includes a differential amplifier including a first differential input terminal pair having a first positive input terminal and a first negative input terminal, a second differential input terminal pair having a second positive input terminal and a second reversed input terminal, a first positive output terminal, and a second positive output terminal, and the first and second positive input terminals receive the time constant signal, the first positive output terminal is connected not only to the first negative input terminal but also to the positive terminal of the inverting amplifier, and the second positive output terminal is connected not only to the second negative input terminal but also to the negative terminal of the inverting amplifier.

7. The filter circuit according to claim 5 wherein the operating point setting circuit includes a first differential amplifier including a first positive input terminal, a first negative input terminal, a first positive output terminal, and a second positive output terminal, and a second differential amplifier including a second positive input terminal, a second negative input terminal, a third positive output terminal, and a fourth positive output terminal, and the first positive input terminal and the second positive input terminal receive the time constant control signal, the first positive output terminal and third positive output terminal are connected not only to the first negative input terminal but also to the first junction point, and the second positive output terminal and fourth positive output terminal are connected not only to the second negative input terminal but also to the second junction point.

* * * * *